US010423200B1

(12) United States Patent
North et al.

(10) Patent No.: US 10,423,200 B1
(45) Date of Patent: Sep. 24, 2019

(54) VAPOR CHAMBER WITH INTEGRATED ROTATING IMPELLER AND METHODS FOR COOLING INFORMATION HANDLING SYSTEMS USING THE SAME

(71) Applicant: DELL PRODUCTS L.P., Round Rock, TX (US)

(72) Inventors: Travis C. North, Cedar Park, TX (US); Qinghong He, Austin, TX (US); Timothy C. Shaw, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/157,517

(22) Filed: Oct. 11, 2018

(51) Int. Cl.
| G06F 1/20 | (2006.01) |
| H05K 7/20 | (2006.01) |
| G06F 1/16 | (2006.01) |

(52) U.S. Cl.
CPC ............ G06F 1/203 (2013.01); G06F 1/1616 (2013.01); G06F 1/1681 (2013.01); H05K 7/20154 (2013.01); H05K 7/20172 (2013.01); H05K 7/20336 (2013.01); *G06F 2200/201* (2013.01)

(58) Field of Classification Search
CPC ...... G06F 1/203; G06F 1/1616; G06F 1/1681; G06F 2200/201; H05K 7/20154; H05K 7/20336; H05K 7/20172
See application file for complete search history.

(56) References Cited

U.S. PATENT DOCUMENTS

| 2010/0155030 | A1* | 6/2010 | Hwang | ............... | F28D 15/0233 |
| | | | | | 165/104.26 |
| 2013/0329357 | A1* | 12/2013 | Degner | .................... | H05K 5/02 |
| | | | | | 361/679.47 |
| 2013/0329934 | A1* | 12/2013 | Casebolt | .................. | H04R 1/02 |
| | | | | | 381/386 |
| 2014/0168896 | A1* | 6/2014 | Fujiwara | .................... | G06F 1/20 |
| | | | | | 361/697 |
| 2016/0128233 | A1* | 5/2016 | Lai | ......................... | G06F 1/1626 |
| | | | | | 165/104.26 |
| 2017/0168529 | A1* | 6/2017 | Wilson | ..................... | G06F 1/203 |
| 2017/0222575 | A1* | 8/2017 | Chin | ..................... | H02K 7/1823 |
| 2018/0100708 | A1* | 4/2018 | Hsieh | ..................... | H01L 23/467 |
| 2019/0059177 | A1* | 2/2019 | Chu | .................... | H05K 7/20409 |

OTHER PUBLICATIONS

North et al., "Apparatus and Methods for Characterizing a Heat Pipe and for Controlling an Operating Parameter of at Least One Heat Generating Component Coupled to the Heat Pipe", U.S. Appl. No. 15/585,509, filed May 3, 2017, Dell:219, 38 pgs.
Celsia, "Heat Pipes and Vapor Chambers-What's the Difference?", Printed from Internet Sep. 29, 2018, 7 pgs.

* cited by examiner

*Primary Examiner* — Anthony M Haughton
*Assistant Examiner* — Yahya Ahmad
(74) *Attorney, Agent, or Firm* — Egan Peterman Enders Huston

(57) ABSTRACT

Vapor chamber and impeller apparatus and systems for cooling information handling systems and which may be implemented to enable increase in system level airflow and to achieve increased cooling surface for cooling heat generating or heat source components of such systems. In one example, an integrated rotating radial impeller may be mounted to and supported by the vapor chamber, and the vapor chamber apparatus may be coupled to one or more heat pipe extensions and corresponding fin stacks.

20 Claims, 14 Drawing Sheets

VAPOR CHAMBER WITH INTEGRATED ROTATING IMPELLER AND METHODS FOR COOLING INFORMATION HANDLING SYSTEMS USING THE SAME

FIELD OF THE INVENTION

This invention relates generally to information handling systems, and more particularly to cooling sources of heat within information handling systems.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

There is continuing market demand for production of modern notebook computers that are packaged ever thinner but without a reduction in performance. One prior technique for meeting increased cooling requirements of thin information handling system packages employs a heat pipe fin stack that includes heat pipes that are coupled to parallel plate stems to form a heat pipe fin stack array over which cooling air is blown by a cooling fan having a cowled-impeller contained in a fan housing. It is also known to provide a graphics card with a radial impeller fan that does not have a surrounding fan housing to cool the graphics processing unit (GPU).

SUMMARY OF THE INVENTION

Disclosed herein are vapor chamber apparatus and systems for cooling information handling systems that may be implemented to enable increase in system level airflow and to achieve increased cooling surface for cooling heat generating or heat source components of such systems. The disclosed apparatus may be implemented in one embodiment with an integrated rotating radial impeller mounted to and supported by the vapor chamber, and the vapor chamber apparatus may be coupled to one or more heat pipe extensions and corresponding fin stacks, with the rotating impeller being mounted to the vapor chamber within a perimeter formed by the fin stacks. In one embodiment, the vapor chamber may characterized as being three-dimensional.

In one embodiment, the rotating impeller may be cowl-less (i.e., the impeller may not have a surrounding cowl or fan housing), and the impeller may be centrally located within the chassis of an information handling system (e.g., such as a notebook computer), such that the chassis interior space functions as a continuous and open fan housing, and such that the impeller produces maximum airflow that is directed radially outward in all directions from the impeller within the chassis to contact surrounding heat sources of the system. In one embodiment, such heat sources may include, for example, heat-generating components such as a central processing device (CPU) and graphics processing unit (GPU) that are mounted within the chassis space adjacent opposite peripheral sides of the impeller, and in respective locations between different fin stacks and the impeller. Other examples of heat sources that may be cooled by the disclosed apparatus and methods include, but are not limited to, platform controller hub (PCH), memory devices such as non-volatile memory devices (e.g., NVRAM, solid state drive, etc.), voltage regulator, charging circuitry, timing controller (T-CON), panel control circuitry, etc.

In one embodiment, the internal structure (e.g., keyboard support structure or other planar component) of the system may be utilized to gasket the edge of the system vapor chamber to multiple sides of a fin stack that may surround the vapor chamber and its impeller on two or more sides, allowing for minimization of frictional losses in turning of the airflow to the fin stack. In one embodiment, fin stacks may be provided on at least two opposing sides of a centralized impeller of the vapor chamber (e.g., at left and right side edges of a notebook computer to form a dual side air exhaust configuration), with heat sources positioned between each of the fin stacks and the impeller. In another embodiment, fin stacks may additionally be provided on at least one additional side of a centralized impeller (e.g., across the back edge hinge barrel location of a notebook computer) in addition to the two opposing sides of the centralized impeller of the vapor chamber.

Combining a centralized cowl-less impeller mounted on a three-dimensional vapor chamber with surrounding fin stacks provides decreased Z-stack of the impeller over a conventional cowled fan, together with increased overall net air flow (e.g., by 20% or greater) over a conventional fan stack arrangement. Other exemplary advantages include increased fin stack surface area (e.g., two times or more), reduced air pressure drop (e.g., by 50% or more), and decreased thermal resistance (resulting in cooling power savings) when compared to a conventional cowled fan and fin stack combination.

In one respect, disclosed herein is a system, including: a first chassis component coupled to a second chassis component around one or more heat sources, a first air intake opening being defined in at least one of the first chassis component or the second chassis component, and at least one air outlet opening defined in at least one of the first chassis component and/or second chassis component; a planar vapor chamber thermally coupled to the one or more heat sources and being positioned between the first chassis component and the second chassis component, where the first chassis component and second chassis component define a cavity contiguous with the vapor chamber, the first air intake opening, and the at least one air outlet opening; a radial impeller disposed in the cavity and rotatably coupled to the vapor chamber, the radial impeller rotating to draw in air from outside the chassis by a first air flow path through the first air intake opening and to exhaust the air by a second air flow path through the at least one air outlet opening; and at least one heat pipe coupled in fluid communication with the vapor chamber, at least a portion of the heat pipe being positioned adjacent or within the second air flow path or the at least one air outlet opening.

In another respect, disclosed herein is an apparatus, including: a planar vapor chamber; a radial impeller rotatably coupled to the vapor chamber; at least one heat pipe coupled in fluid communication with the vapor chamber, the vapor chamber being an evaporator and the heat pipe being a condenser for a working fluid contained therein; and at least one fin stack thermally coupled to the at least one heat pipe, the at least one fin stack including a plurality of parallel plates. The one or more openings may be defined through the plane of the vapor chamber to provide an air flow path through the vapor chamber to an intake of the radial fan.

In another respect, disclosed herein is a method, including operating a system that includes a first chassis component coupled to a second chassis component around one or more heat sources, a first air intake opening being defined in at least one of the first chassis component or the second chassis component, and at least one air outlet opening defined in at least one of the first chassis component and/or second chassis component; a planar vapor chamber thermally coupled to the one or more heat sources generating heat, the vapor chamber being positioned between the first chassis component and the second chassis component, where the first chassis component and second chassis component define a cavity contiguous with the vapor chamber, the first air intake opening, and the at least one air outlet opening; a radial impeller disposed in the cavity and rotatably coupled to the vapor chamber; and at least one heat pipe coupled in fluid communication with the vapor chamber. The method may also include: rotating the radial impeller to draw in air from outside the chassis by a first air flow path through the first air intake opening and to exhaust the air by a second air flow path through the at least one air outlet opening, at least a portion of the heat pipe being positioned adjacent or within the second air flow path or the at least one air outlet opening; absorbing heat in the vapor chamber from the one or more heat sources to vaporize at least a portion of liquid working fluid contained within the vapor chamber and cause the vaporized fluid to travel from the vapor chamber to the heat pipe; and causing the exhausted air to absorb heat from the at least a portion of the heat pipe positioned adjacent or within the second air flow path to condense the vaporize working fluid back into a condensed liquid that returns to the vapor chamber.

DESCRIPTION OF ILLUSTRATIVE EMBODIMENTS

Figure 1A:
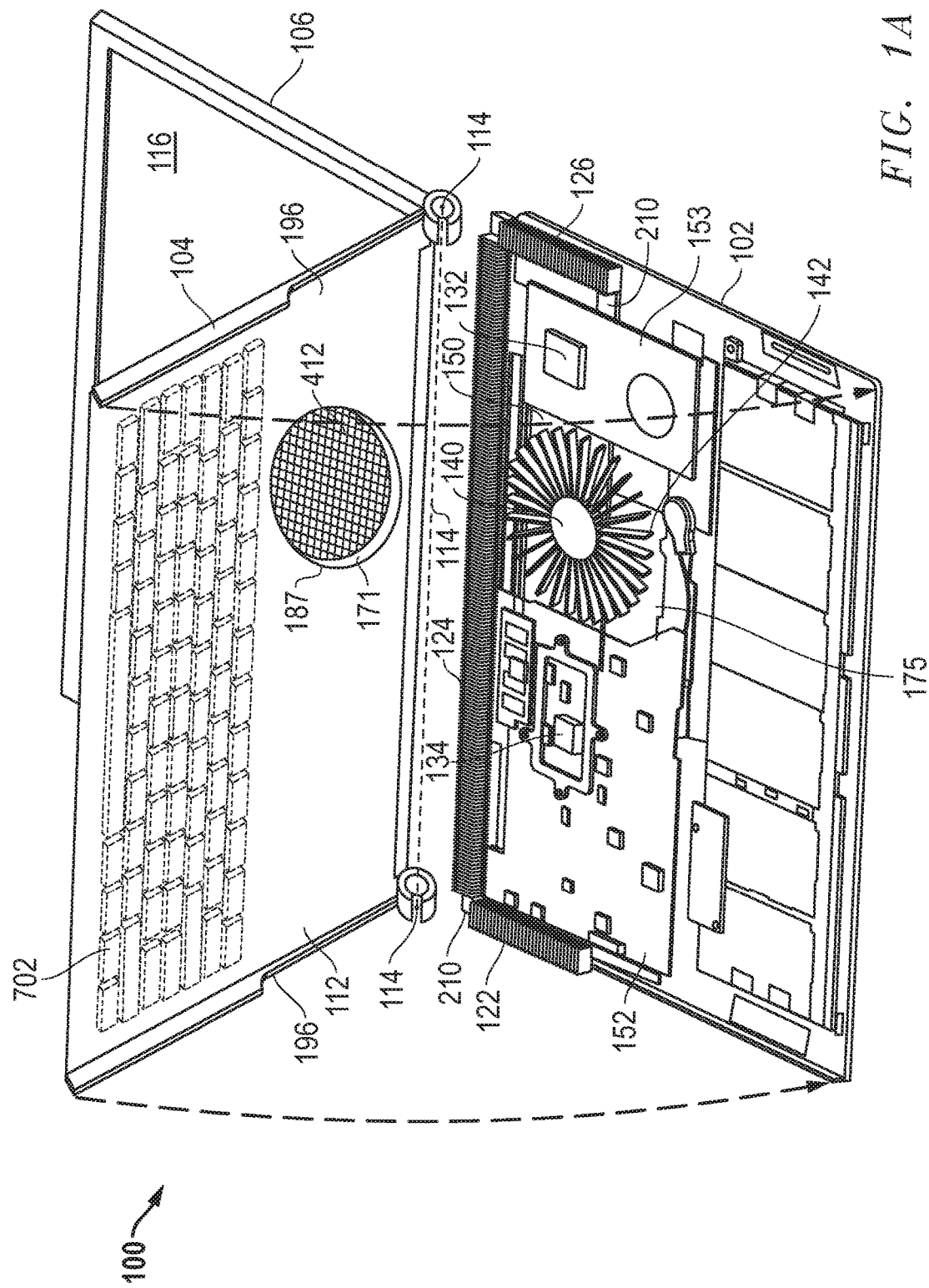
FIG. 1A illustrates an exploded overhead perspective view of the topside of a portable information handling system according to one exemplary embodiment of the disclosed apparatus and methods.

FIG. 1A illustrates an exploded overhead perspective view of the topside of one exemplary embodiment of a portable information handling system 100 configured in the form of a notebook computer. Although a notebook computer is illustrated, it will be understood that the disclosed apparatus and methods may be employed for cooling other types of information handling systems and portable information handling systems, e.g., such as a desktop computers, laptop computers, tablet computers, MP3 players, personal data assistants (PDAs), cell phones, etc.). In this regard, it will be understood that the configuration of FIG. 1A is exemplary only, and that the disclosed apparatuses and methods may be implemented with other types of information handling systems.

In FIG. 1A, notebook computer 100 includes an upper chassis component 104 and a lower chassis component 102 which are assembled together to contain a motherboard 152 (printed circuit board with attached CPU 134) and graphics card 153 (printed circuit board with attached GPU 132) therebetween. As will be shown and described further herein, an elongated vapor chamber component 150 (e.g., made of conductive metal such as copper or aluminum) extends from a left to a right side of the notebook computer 100 and is thermally coupled to support, and to dissipate heat from, each of the motherboard 152 (with attached CPU 134) and graphics card 150 (with attached GPU 132). A folding lid 106 (e.g., with LCD or LED video display 116) is connected to the upper chassis component 104 by a hinge line 114 (e.g., one or more hinges) as shown in dashed outline. In the embodiment of FIG. 1A, a cowl-less radial impeller 142 is rotatably mounted to and supported by the vapor chamber 150 between the motherboard 152 and graphics card 150 within a vapor chamber space of vapor chamber 150. In this regard, a hub 140 of the impeller 142 is rotatably mounted to the body of the vapor chamber 150 by a impeller axle 650 received in one or more impeller mounts 160 (e.g., threaded or smooth opening defined in vapor chamber 150, fastener/s for mating with fastener/s of impeller axle 650, etc.) of vapor chamber 150 (shown in FIG. 6) to directly mount the impeller 142 to the vapor chamber 150. A motor (windings and coil, etc.) for rotating the impeller may be integrated within the hub of impeller as is known in the art. Vanes 415 of impeller may be of any suitable configuration to suit the needs of a given application, e.g., forward-curved, backward-curved, paddle wheel (as shown), etc. In one embodiment, individual vanes 415 may be optionally tapered to be thinner at the hub 140.

Figure 1B:
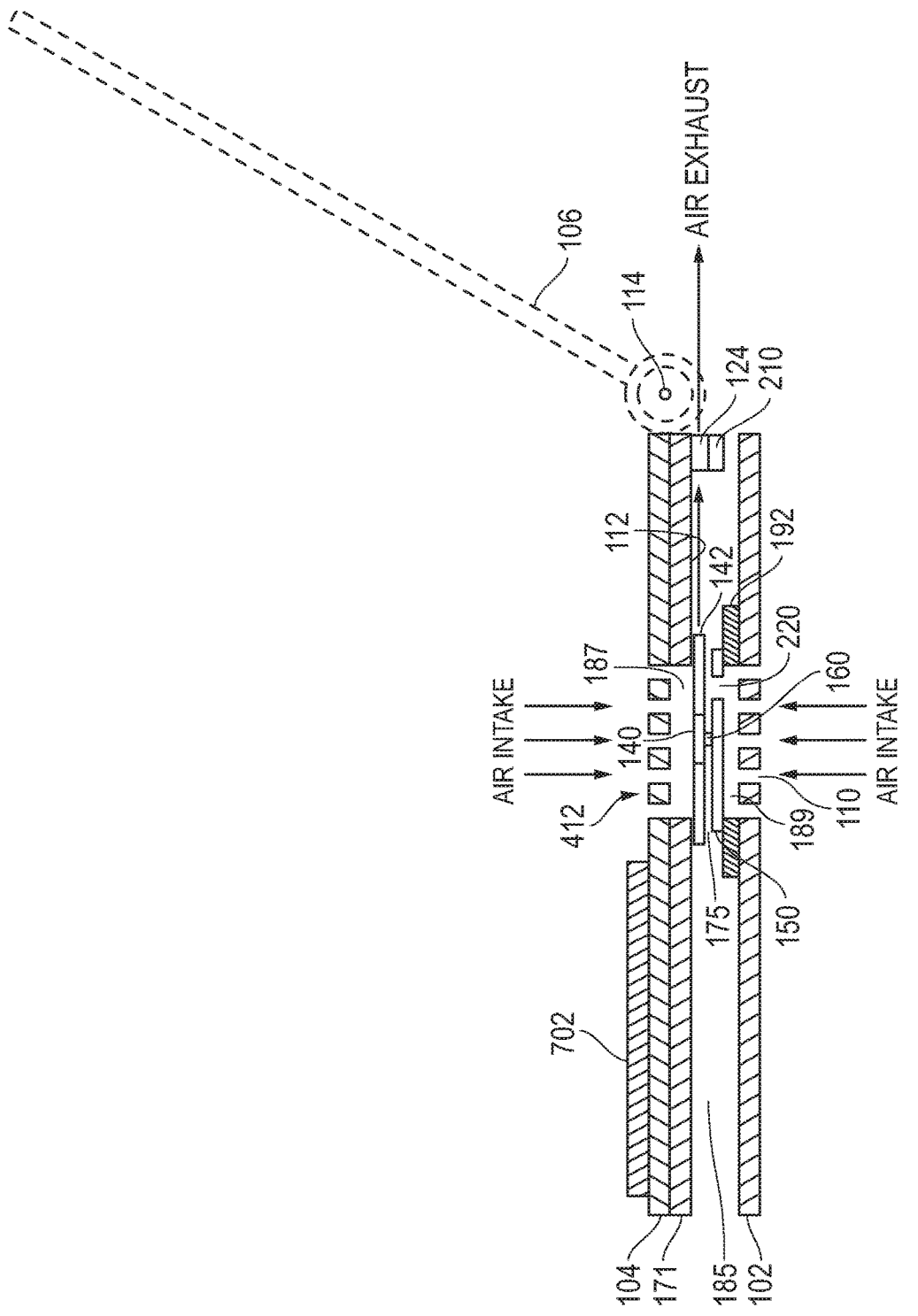
FIG. 1B illustrates a side cross sectional view of a portable information handling system according to one exemplary embodiment of the disclosed apparatus and methods.
Figure 7A:
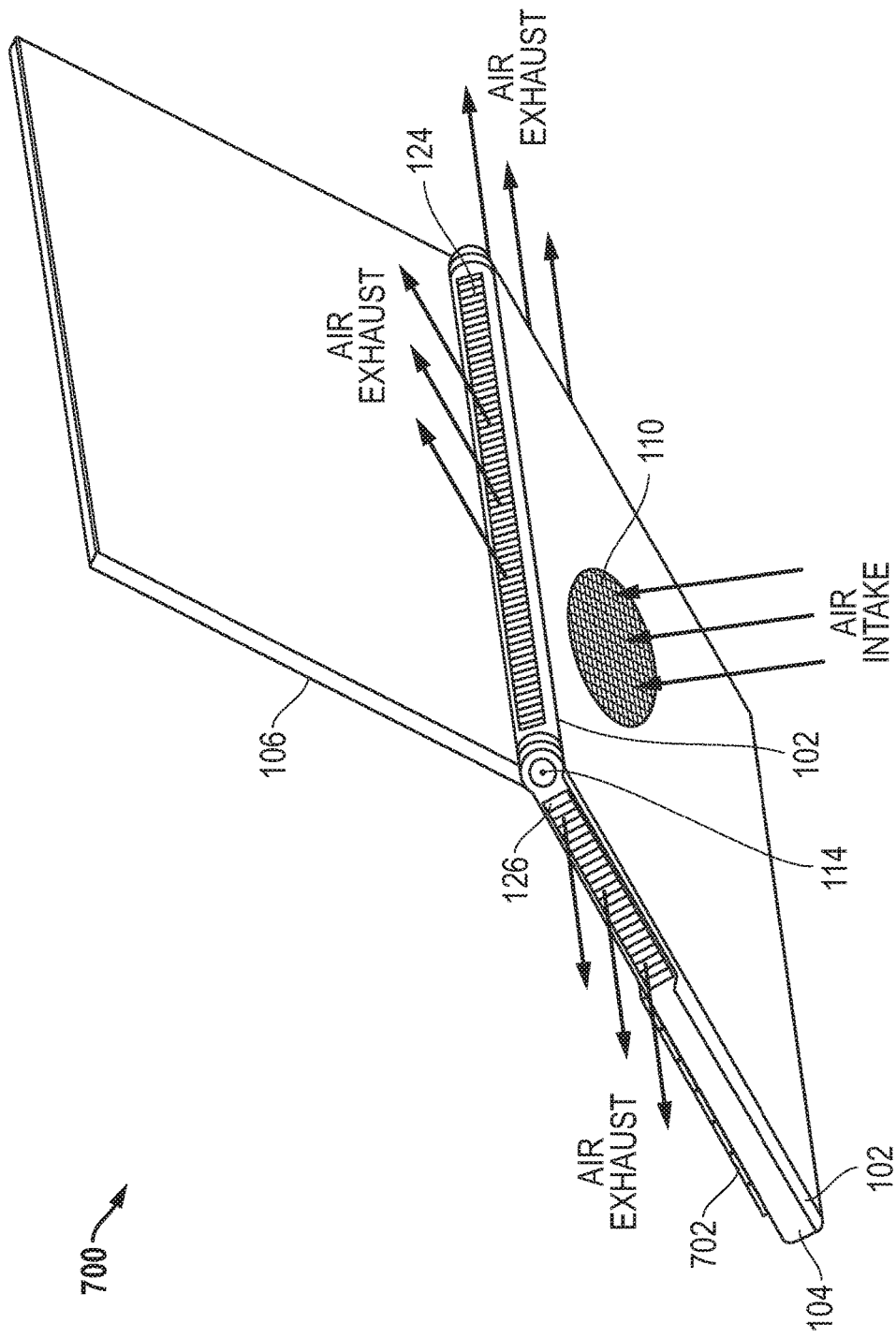
FIG. 7A illustrates a rear underside perspective view of a portable information handling system according to one exemplary embodiment of the disclosed apparatus and methods.
Figure 7B:
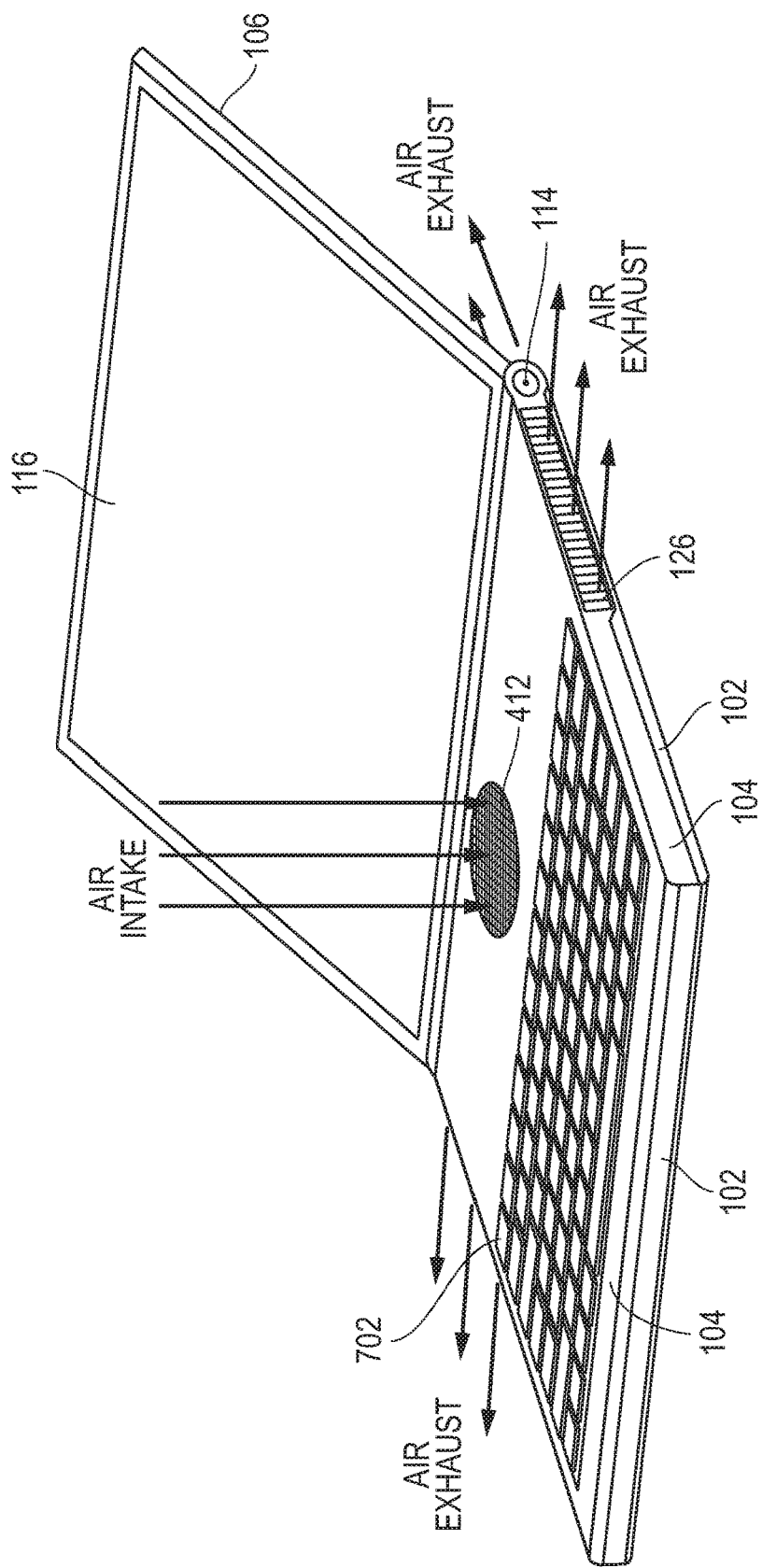
FIG. 7B illustrates a front topside perspective view of a portable information handling system according to one exemplary embodiment of the disclosed apparatus and methods.
Figure 8A:
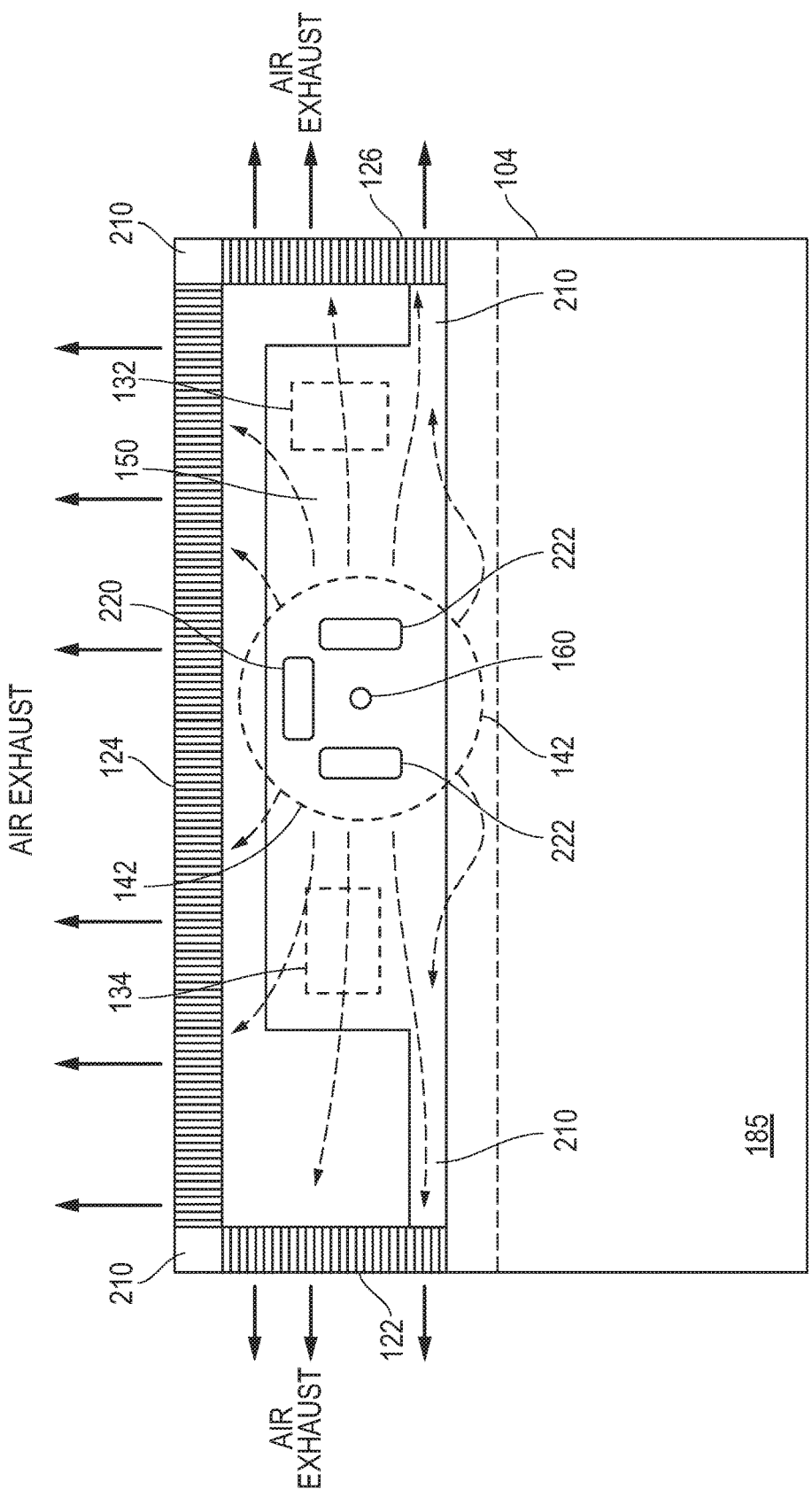
FIG. 8A illustrates an overhead cross-sectional view of a portable information handling system according to one exemplary embodiment of the disclosed apparatus and methods.
Figure 8B:
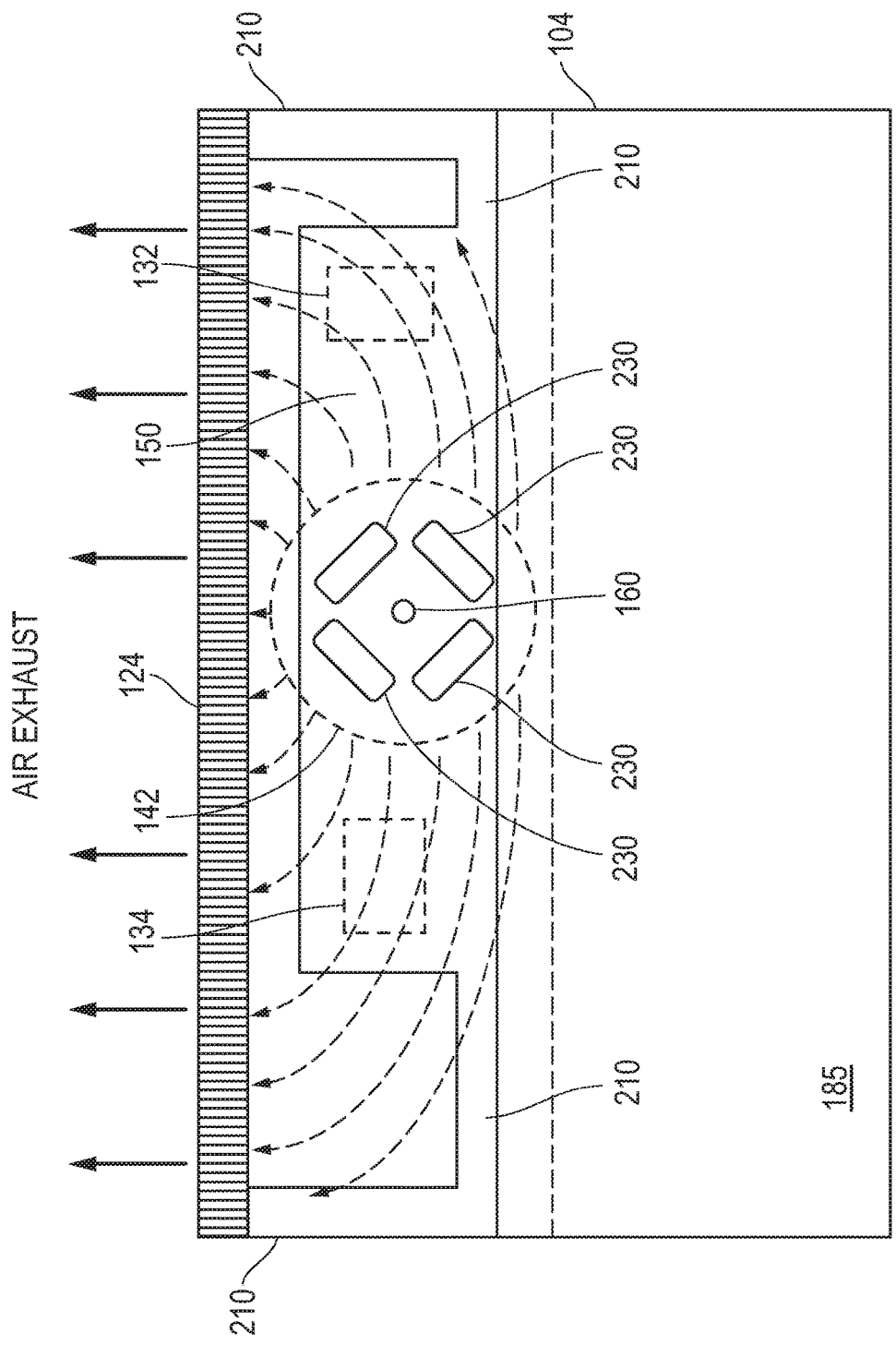
FIG. 8B illustrates an overhead cross-sectional view of a portable information handling system according to one exemplary embodiment of the disclosed apparatus and methods.
Figure 8C:
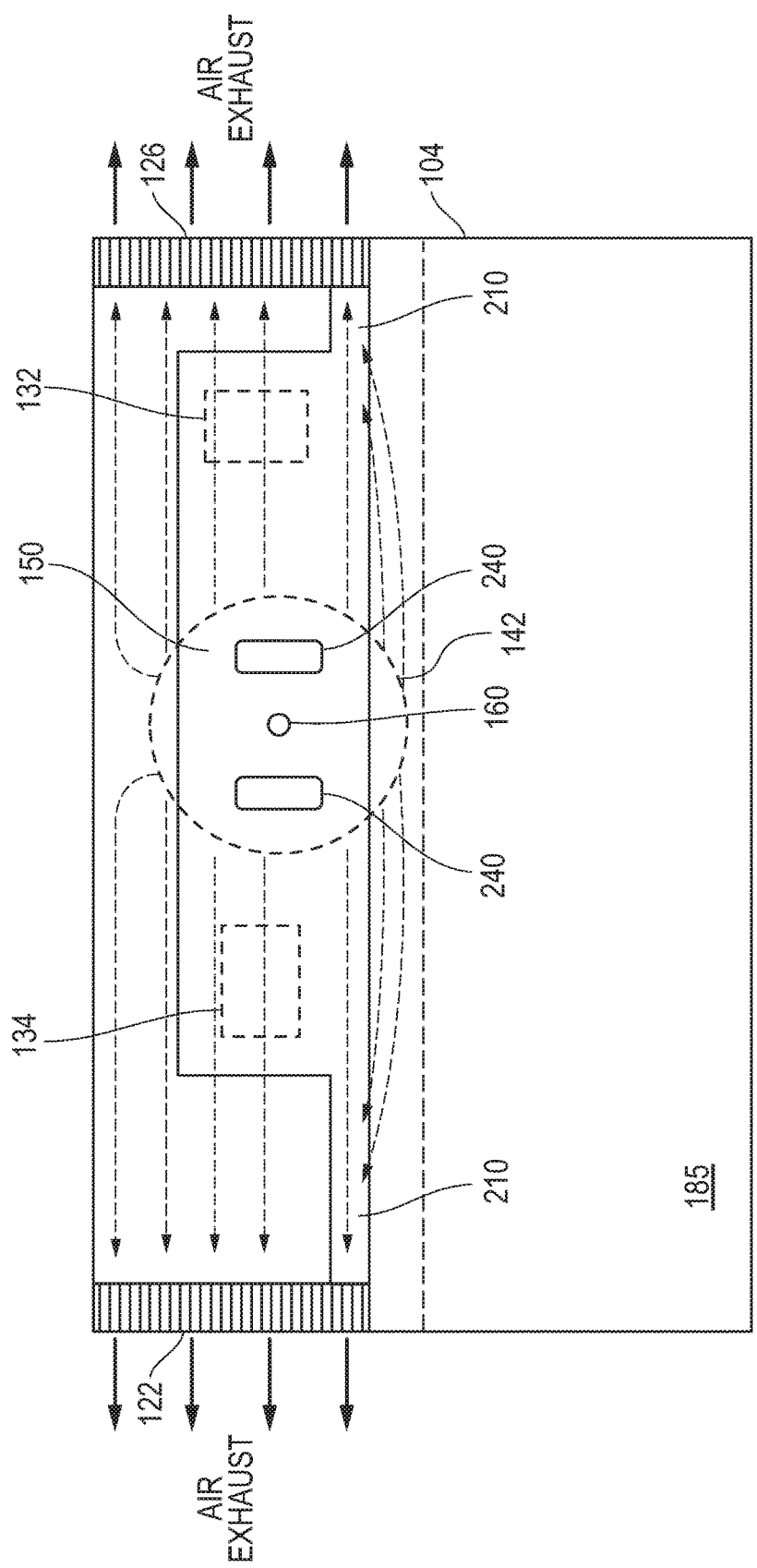
FIG. 8C illustrates an overhead cross-sectional view of a portable information handling system according to one exemplary embodiment of the disclosed apparatus and methods.

As shown in FIGS. 1A and 1B, the upper chassis component 104 of this embodiment includes a circular-shaped top side air intake opening 412 in the form of a grated or perforated air flow pattern defined through the top wall of the upper chassis component 104 and aligned with a cut-out opening 187 defined in keyboard support material 171 (e.g., rubber, acrylic, plastic, etc.) adjacent the overlying keyboard area 702 which is illustrated in dashed lines and is further shown from the top in FIG. 7B. As shown in FIGS. 1A and 1B, the center of opening 187 is aligned with the center of the impeller 142 when the lower chassis component 102 is mated with and attached to the upper chassis component 104. As further shown, an impeller cavity 175 is created above vapor chamber 150, below interior surface 112 of upper chassis component 104, and between boards 152 and 153 to contain the impeller 142 and allow it to rotate when the lower chassis component 102 is assembled to the upper chassis component 104 as shown in FIGS. 1B, 7A and 7B. Interior surface 112 is also spaced above and apart from boards 152 and 153 to create a sideways-extending air flow cavity between interior surface 112 and boards 152 and 153 (including their components) that is contiguous with the impeller cavity 175 to allow air to flow from impeller 142 to the fin stacks 122, 124 and 126 when the lower chassis component 102 is assembled to the upper chassis component 104. Also denoted in the side cross-sectional view of FIG. 1B and overhead cross-sectional views of FIGS. 8A-8C is section 185 of the assembled chassis which may support or otherwise contain keyboard 702, as well as user input, storage, and other system electronics components.

As further shown in FIG. 1A, opening of top side air intake 412 may be defined through the outer chassis shell component (e.g., metal, plastic, etc.). In FIG. 1A, opening 187 defined in the keyboard support material 171 (e.g., acrylic, rubber, plastic, etc.) has a smaller inner diameter than the outer diameter of the impeller 142 so as to function as an impeller gasket for impeller 142 when upper chassis component 104 is assembled to lower chassis component 102. In this regard, the plane of the interior surface of the keyboard support material 171 is closely-spaced (e.g., by from about 1 millimeter to about 1.2 millimeters in one embodiment) above impeller 142 (and in parallel with impeller 142) so as to prevent outflow of impeller-driven air around the peripheral edges of the air intake 412. In one exemplary embodiment, the diameter of air intake 412 and its aligned opening 187 in keyboard support material 171 may be dimensioned to extend to a radius that is two-thirds or less of the radius of the radial impeller 142, e.g., in the case of a radial impeller having a radius of 90 millimeter, each of air intake 412 and corresponding opening 187 in keyboard support material 171 may have a radius of 60 millimeters as measured from the center of hub 140 of impeller 142 when lower chassis component is mated with upper chassis component 104. In such a configuration, one-third of the impeller 142 is not overlapped or open to the opening 187. Thickness of keyboard support material may be 0.4 millimeters in one embodiment, although any greater or lesser thickness suitable for achieving the desired spacing between the interior surface of keyboard support material 171 and the top of impeller 142 when chassis components 102 and 104 are assembled to form the given system Z-stack thickness.

Figure 1C:
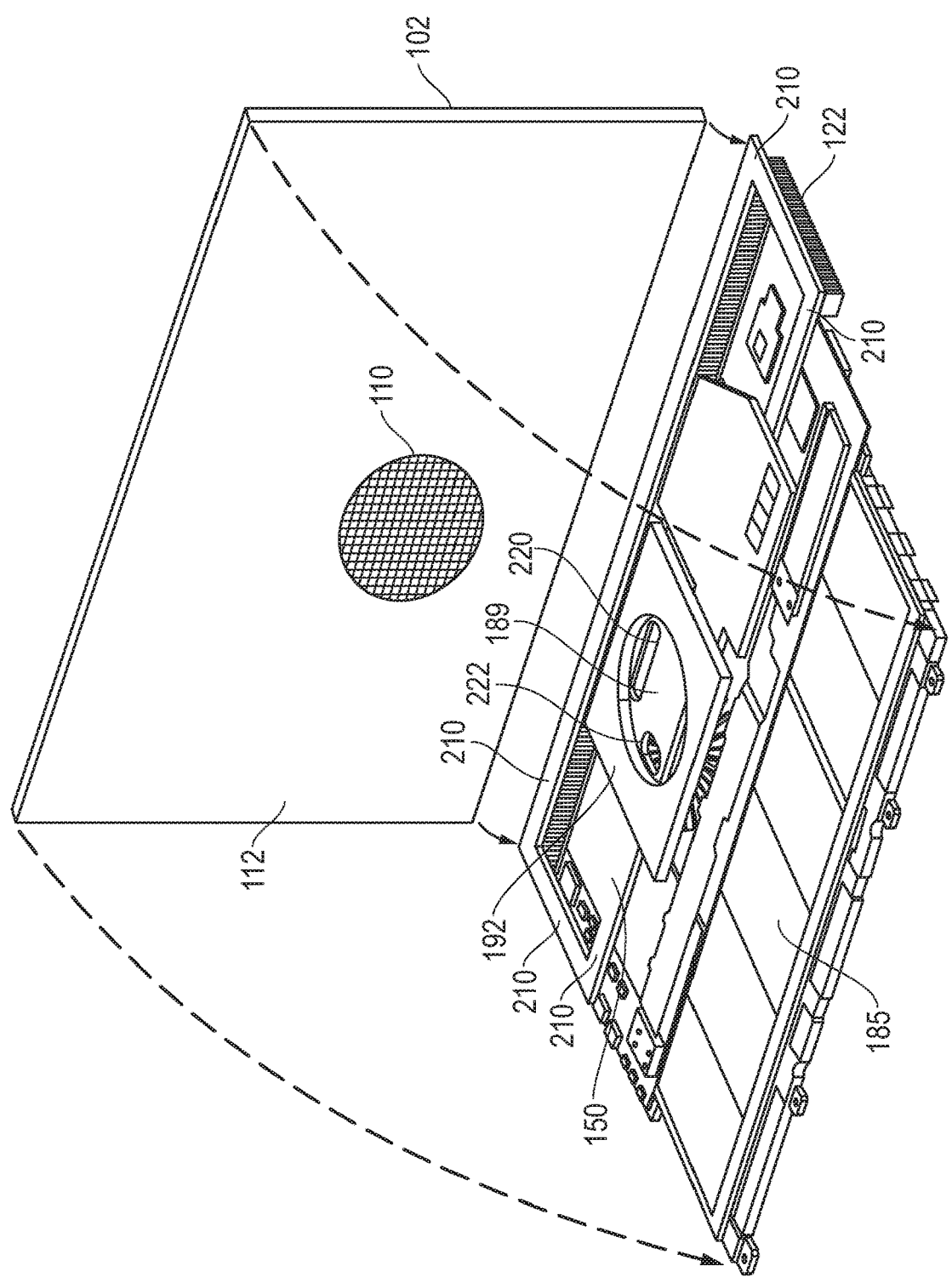
FIG. 1C illustrates an underside perspective view of a portable information handling system according to one exemplary embodiment of the disclosed apparatus and methods.
Figure 1D:
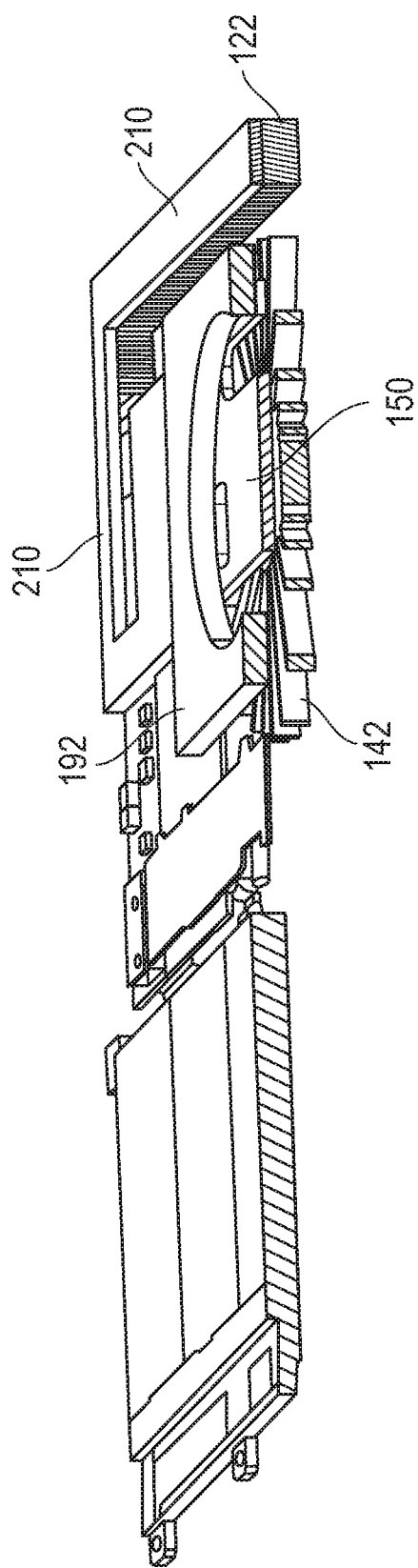
FIG. 1D illustrates an underside cross-sectional perspective view of a portable information handling system according to one exemplary embodiment of the disclosed apparatus and methods.

As further shown in FIG. 1B, and further in the underside perspective view of FIG. 1C and the underside cross-sectional perspective view of FIG. 1D, a planar gasket 192 may be positioned between the vapor chamber 150 and a second and bottom air intake 110 (e.g., screened or perforated) defined thorough the body of the lower chassis component 102. In this position, gasket 192 may have an opening 189 provided therein that is aligned as shown with bottom air intake 110, and gasket 192 may be so provided so as to prevent outflow of impeller-driven air around the peripheral edges of the air intake 110. As with opening 187 defined in keyboard support material 171, the diameter of opening 189 defined in its surrounding gasket 192 may be sized to extend within two-thirds or less of the diameter of the radial impeller 142 and to enclose the vapor chamber openings 220 and 222, e.g., in the case of a 90 millimeter radial impeller, opening 189 may have a diameter of 60 millimeters as measured from the center of hub 140 of impeller 142 when lower chassis component is mated with upper chassis component 104. As further shown in this embodiment, gasket structure 192 may be made of similar material and thickness as keyboard support material 171 (e.g., acrylic, rubber, plastic, etc.), for example, thickness of gasket 192 may be 0.4 millimeters in one embodiment, although any greater or lesser thickness suitable for achieving the desired spacing between the interior surface of gasket 192 and the top of impeller 142 (e.g., less than 1.2 millimeters in one embodiment) when chassis components 102 and 104 are assembled to form the given system Z-stack thickness.

Returning to FIGS. 1A and 1B, impeller 142 is positioned in a space or cavity 175 above the vapor chamber 150 and is coupled in fluid communication with heat pipes 210 that extend from the opposing sides of vapor chamber 150 and wrap around both side edges of the assembled notebook computer 100 and along the back hinge line 114 (i.e., axis around which lid 106 opens) of the assembled notebook computer 100. As shown, fin stacks 122 and 126 are thermally coupled to (or otherwise integrated with) the two opposing side edge heat pipes 210, and fin stack 124 is coupled to the back edge heat pipe 210. In this regard, each of fin stacks 122, 123 and 124 may include conductive fins (e.g., thermally conductive metal such as copper or aluminum) that are coupled in thermal communication with a respective heat pipe 210, and that provide a path for dissipating heat from the heat pipes 210 to the flowing air that is blown through the fins by impeller 142. Thus, in this embodiment, fin stacks 122, 124 and 125 are configured in position along the entire back edge and both rear side edges of the assembled system 100, and are supported by heat pipes 210 that are disposed in line with (i.e., in the same plane as) the plane of vapor chamber 150.

In the embodiment of FIG. 1A, the vapor chamber 150 is in contact with both boards 152 and 153 and with the impeller 142 positioned between (e.g., centered between) the boards 152 and 153. In the illustrated embodiment, openings (e.g., slots) 196 are defined in the back edge and rear side sections of upper chassis component 104 for receiving fin stacks 122, 124 and 126 to allow air to exhaust when the cassis components 102 and 104 are assembled. However, openings for the fin stacks may be formed in any other suitable manner in either or both of the chassis components 102 and/or 104. It will also be understood that the fin stack/s may be integrated with the heat pipes 210 in any suitable configuration, e.g., as a single continuous fin stack that wraps around the entire back edge and rear side edges of the system 100, or with the back edge fin stack 124 split in two or multiple and non-contiguous sections.

It will further be understood that the configuration of FIG. 1A is exemplary only, and that a vapor chamber 150 may be integrated with heat pipes 210 in any other suitable configuration, e.g., including configurations where vapor chamber 150 is not disposed in the same plane as one or more heat pipes 210 and/or where vapor chamber 150 is in contact with any other number of heat sources such as with a single printed circuit board (PCB) or with three or more heat sources. Moreover, impeller 142 need not be centered between the side edges of the system 100. Some possible alternative example configurations are described and illustrated in relation to overhead cross-sectional views of FIGS. 8A to 8C. Further, it is possible that only one air intake opening (e.g., opening 412 or opening 110) may be defined in the system chassis and/or that a radial impeller 142 may be mounted on a vapor chamber 150 to face either the upper chassis component 104 (as shown), or alternatively to face the lower chassis component 102 with the impeller mounted to the vapor chamber 150 in a position between the vapor chamber 150 and an opening 110 in the lower chassis component 102.

Figure 2:
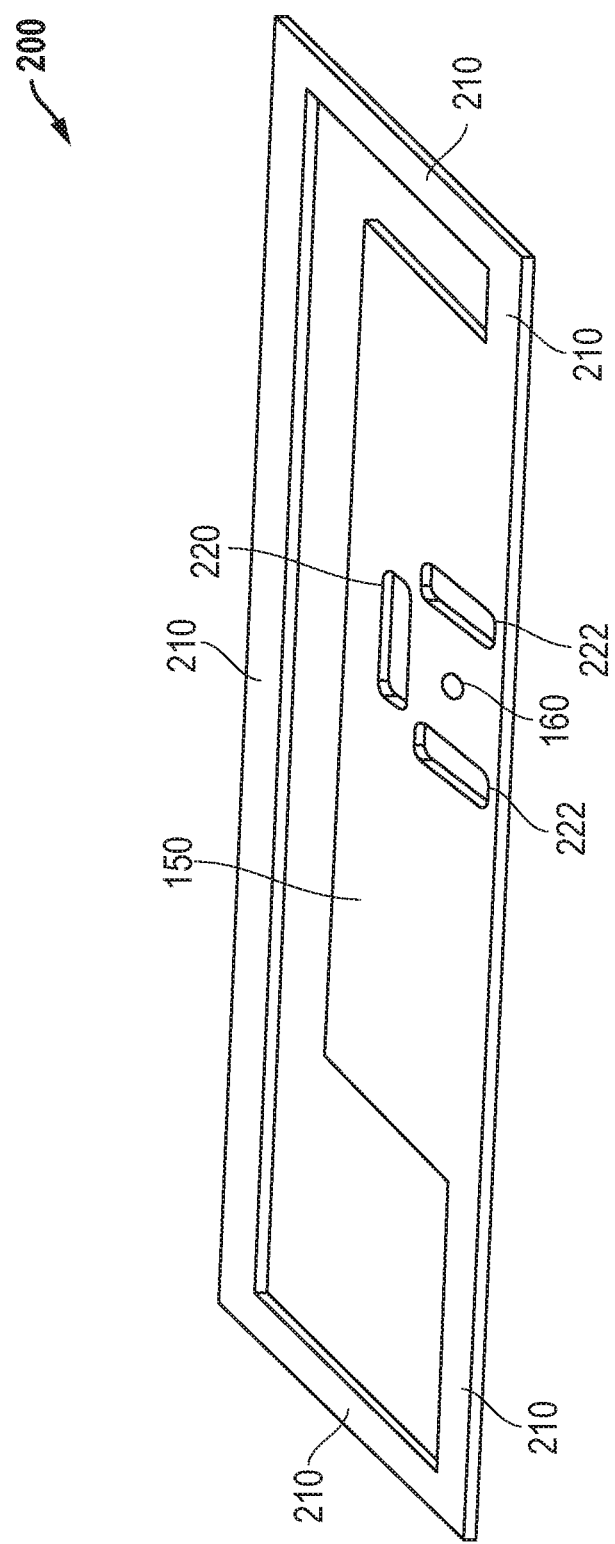
FIG. 2 illustrates a perspective view of the topside of a vapor chamber according to one exemplary embodiment of the disclosed apparatus and methods.

FIG. 2 illustrates a perspective view 200 of the topside of vapor chamber 150 of FIG. 1A that is coupled in fluid communication with heat pipe segments 210 that are configured to wrap around the sides and back of notebook computer 100 to provide a continuous path for a working fluid. As known in the art, a heat pipe 210 may form a part of a closed evaporator-condenser system, may generally be constructed of a sealed, hollow tube (which may be flattened), and is partially filled with a working fluid or coolant. Vapor chamber 150 may be similarly constructed, but to have a larger planar surface area with resulting larger interior cross-sectional fluid flow area than heat pipes 210. In some heat pipes and/or vapor chambers, the inside walls of the heat pipe/vapor chamber may be lined with a capillary structure or wick. In the illustrated embodiment, when heat is absorbed from heat sources at the hot interface of the vapor chamber 150 (i.e., the evaporator section), at least a portion of the working fluid vaporizes into a gas, which travels through the adiabatic section of the vapor chamber/heat pipe to the cold interface of the heat pipes 210 (i.e., the condenser section), where it condenses back into a liquid—releasing the latent heat. The condensed liquid then returns to the hot interface of the vapor chamber 150, e.g., via capillary action through the wick, and the cycle repeats. In one embodiment, due to high heat transfer coefficients for evaporation and condensation, vapor chamber 150 and heat pipes 210 may be constructed to be highly effective thermal conductors. Further information on heat pipes, methods of operating same, and systems that employ the same, may be found described in U.S. patent application Ser. No. 15/585,509 by North et al., filed May 3, 2017, which is incorporated herein by reference in its entirety for all purposes.

In the illustrated embodiment, vapor chamber 150 is coupled in sealed fluid communication with heat pipe segments 210 to form a continuous closed evaporator-condenser system, in which vapor chamber 150 functions as an evaporator section that absorbs heat from heat sources (e.g., CPU 134 and GPU 132) which vaporizes the working fluid which then travels to the side and back heat pipe segments 210 that function as condenser sections.

As shown in FIG. 2, vapor chamber 150 includes an air flow opening 220 and two air flow openings 222 that are defined to extend through the planar body of vapor chamber 150 in positions that surround the position of an impeller mount 160 that is provided on the vapor chamber 150. FIG. 8A shows in dashed outline how the periphery or operating area of impeller 142 overlies the position of vapor chamber openings 220 and 222 in overlapping fashion when hub 140 of impeller 142 is rotatably mounted to vapor chamber 150 at the location of mount 160. When so positioned, vapor chamber openings 220 and 222 function together to allow air flow to impeller 142 through vapor chamber 150 from the bottom side air intake 110 that is defined through the bottom wall of the lower notebook component 102 adjacent the keyboard 702 as shown in FIGS. 1B and 7A. In this embodiment, the center of air intake 110 is aligned with the center of the impeller 142 when the lower chassis component 102 is mated with and attached to the upper chassis component 104.

It will be understood that openings such as 220 and 222 may be defined in a vapor chamber 150 in any alternative number and/or geometry, e.g., as shown in FIGS. 8A to 8C. In one exemplary embodiment, such vapor chamber openings are positioned within a radius that is two-thirds or less of the outer radius of the impeller 142 as measured from the central position of the impeller axle 650 and its corresponding impeller mount 160. For example, in the case where the outer radius of impeller 142 is 90 millimeters measured from the center of the impeller or the central impeller mount, the openings 200 and 220 may be defined within (inside) a radius distance of 60 millimeters measured from the center of the impeller or the central impeller mount 160. However, in other embodiments, vapor chamber openings may alternatively be defined outside this radius, i.e., greater than two-thirds from the center of the impeller or the impeller mount 160, e.g., to fit characteristics of a given application.

In a further exemplary embodiment, the vapor chamber openings 200 and 220 may be limited in size so as not to exceed 50% of the lateral (fluid flow) cross sectional area of the vapor chamber 150 at any point within the vapor chamber to help ensure that the sonic limit of the vapor chamber 150 is not encroached upon, and to ensure proper fluid flow back through the vapor chamber in the region of the vapor chamber openings. However, this vapor chamber opening size limitation is also exemplary, and it is possible that in other embodiments vapor chamber openings may be exceed 50% of the lateral (fluid flow) cross sectional area of the vapor chamber 150, e.g., to fit characteristics of a given application. In another embodiment, no vapor chamber openings may be provided, e.g., in the case where only a single air intake 110 is provided. Moreover, a radial impeller of any other suitable greater or lesser diameter may employed in other embodiments, e.g., greater than 90 millimeters or less than 90 millimeters.

Figure 3:
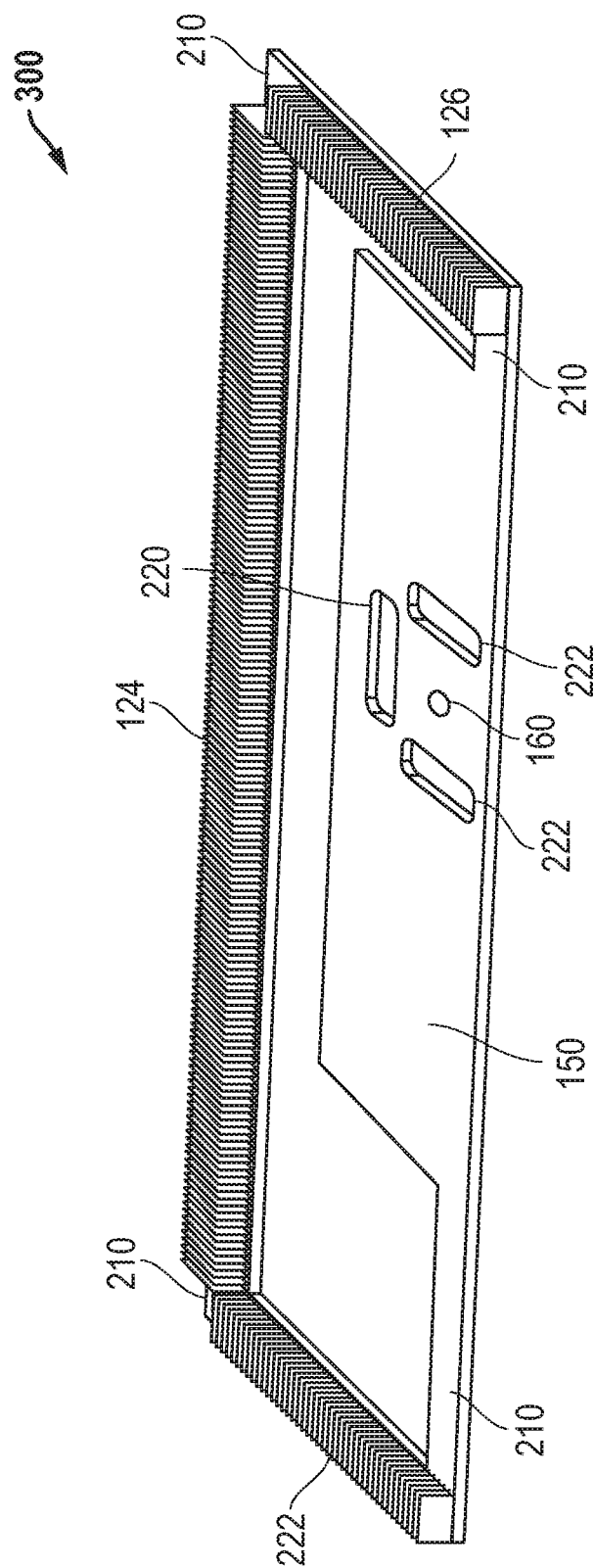
FIG. 3 illustrates an underside perspective view of a portable information handling system according to one exemplary embodiment of the disclosed apparatus and methods.

FIG. 3 illustrates an underside perspective view 300 of the vapor chamber 150 and heat pipes 210 of FIG. 2, with the thin parallel plates of fin stacks 122, 124 and 126 shown thermally coupled to the heat pipes 210 such that the fin stacks wrap around the sides and back of notebook computer 100 to provide exhaust air paths though the spaces between fin stack plates from the inside of the chassis of system 100 to the outside of system 100 as shown by the arrows in FIGS. 7A, 7B and 8A.

Figure 4:
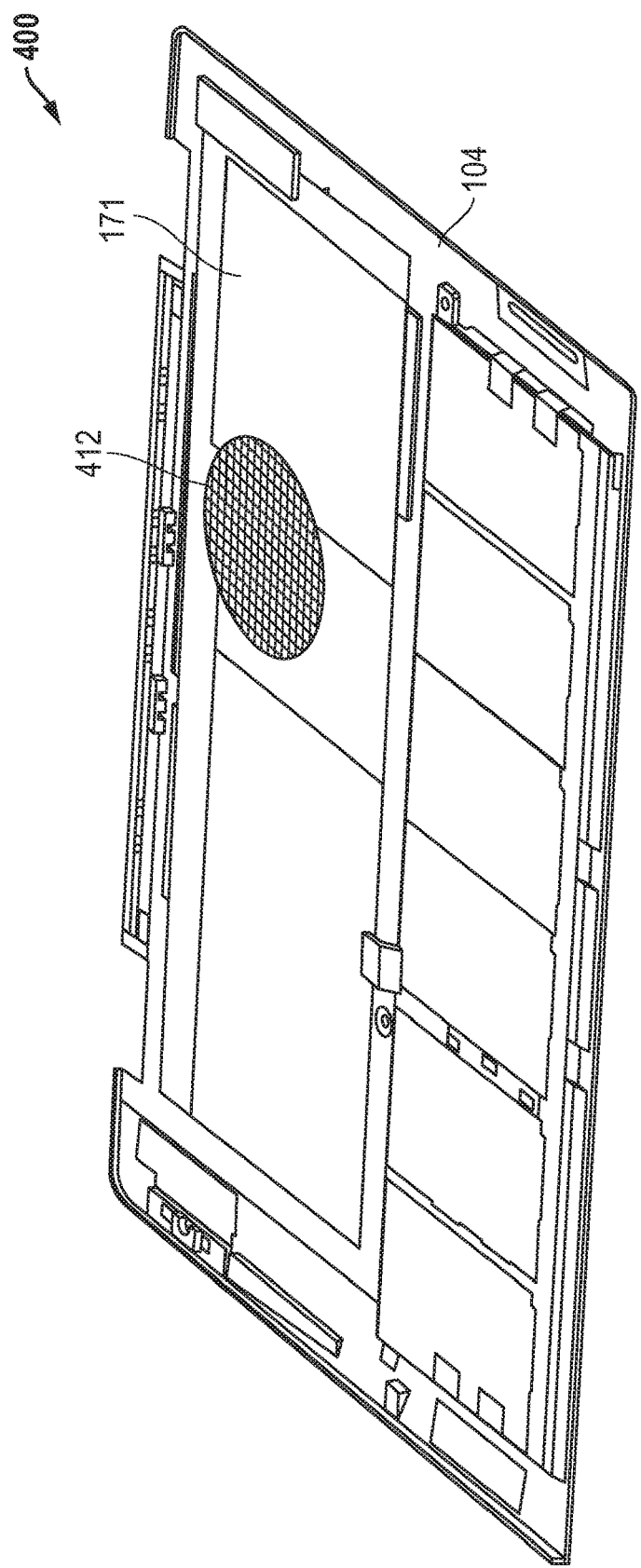
FIG. 4 illustrates an underside perspective view of an upper chassis component according to one exemplary embodiment of the disclosed apparatus and methods.

FIG. 4 illustrates an underside perspective view 400 of upper chassis component 104 of FIG. 1A, with the vapor chamber, heat pipes, fin stacks, motherboard, graphics card and impeller removed. Visible in FIG. 4 is the circular top side air intake 412 that provides an air intake path (as illustrated in FIG. 7B) from the top of the system. In this embodiment, the center of air intake 412 is aligned with the center or axis of the impeller 142 when the lower chassis component 102 is mated with and attached to the upper chassis component 104.

Figure 5:
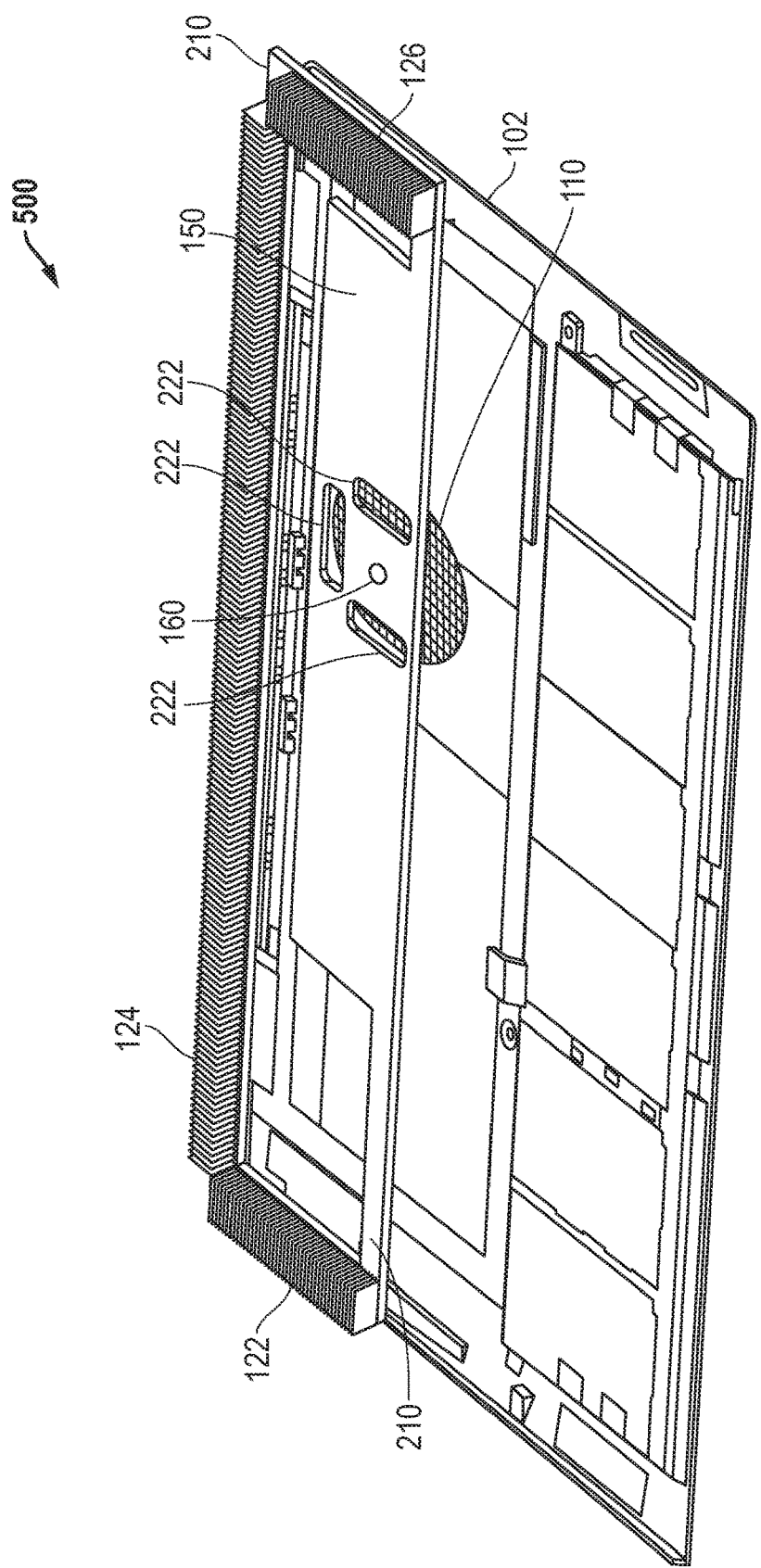
FIG. 5 illustrates a topside frontal perspective view of a lower chassis component according to one exemplary embodiment of the disclosed apparatus and methods.

FIG. 5 illustrates a topside frontal perspective view 500 of lower chassis component 102 of FIG. 4, with the integrated vapor chamber 150, heat pipes 210, and fin stacks 122/124/126 coupled in place across the back edge and rear side sections of lower chassis component 102. To make bottom side air intake 110 visible, gasket 192 is not shown in FIG. 5, but is illustrated in FIGS. 1B, 1C and 1D.

Figure 6:
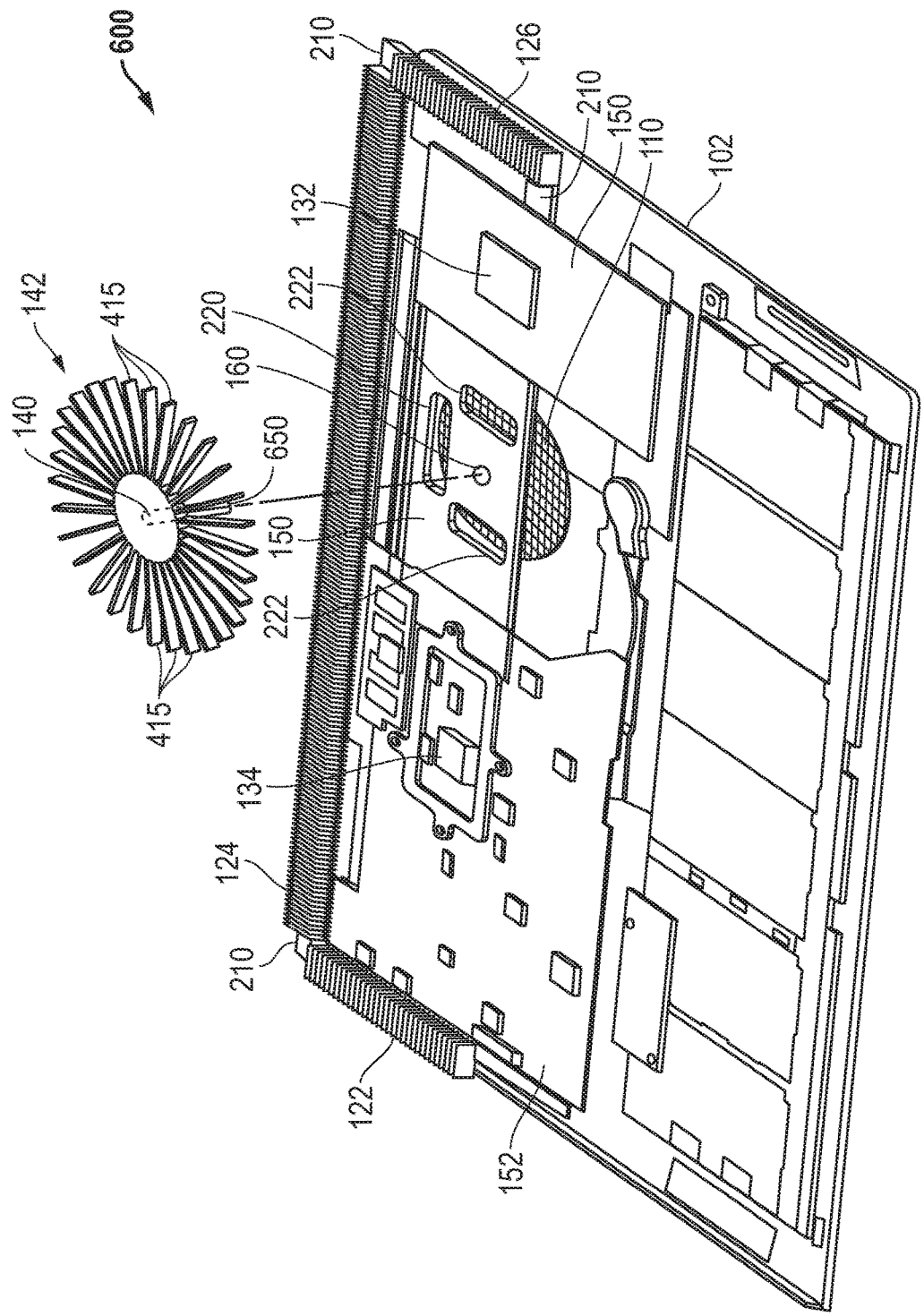
FIG. 6 illustrates an overhead perspective view of the top side of a lower chassis component according to one exemplary embodiment of the disclosed apparatus and methods.

FIG. 6 illustrates an overhead perspective view 600 of the top side of lower chassis component 102 of FIG. 5, with the motherboard 152 (including CPU 134) and graphics card 132 (including GPU 132) assembled in thermal contact with the vapor chamber 150. Also shown in FIG. 6 is vaned radial impeller 142 with its impeller axle 650 positioned for assembly to impeller mount 160 of vapor chamber 150 as indicated by the dashed line. As shown in FIG. 6, vanes 415 of impeller 142 are free standing with no top or bottom cap or plate, so that impeller 142 is open on both top and bottom sides (i.e., without a fan plate) to allow simultaneous dual air intake from both above and below the impeller 142 when impeller 142 is rotating. This air is then exhausted in all side directions around the circumference of impeller 142 as impeller 142 rotates. In an alternative embodiment, a fan plate may be provided on one side of a impeller 142 (top or bottom side) to close off the impeller on the other side, i.e., where only a single air intake opening 110 or 412 is provided.

FIGS. 7A and 7B illustrate rear underside and front topside perspective views of an assembled notebook computer system 100 of FIG. 1A, respectively. As shown, rotation of impeller 142 inside notebook computer system 100 while the system is powered on draws in ambient cooling air simultaneously through both bottom air intake 110 and top air intake 412 (in the direction of the arrows) into the internal vapor chamber impeller cavity 175 defined between the top air intake 412 and vapor chamber 150 of the assembled notebook chassis. Impeller 142 in turn expels this air outward in all directions to cause air to flow between the plane of boards 152 and 153 and the plane of interior surface 112 of upper chassis component 104 from the outer periphery of the impeller 142 through fin stacks 122, 124 and 126, e.g., as shown by the arrows in overhead cross-sectional view of FIG. 8A.

When so positioned, vapor chamber openings 220 and 222 function together to allow air flow to impeller 142 through vapor chamber 150 from the second and bottom side air intake 110 defined through the wall of the lower notebook component 102 adjacent the keyboard 702, e.g., as shown in FIGS. 1B and 7A. In this embodiment, the center of air intake 110 is aligned with the center of the impeller 142 when the lower chassis component 102 is mated with and attached to the upper chassis component 104. This forms a dual-intake, tri-exhaust cooling air flow configuration in this exemplary embodiment.

Other possible example configurations of vapor chamber openings 230 and 240, as well as different configurations and numbers of fin stacks 122, 124, and/or 126 are illustrated in the overhead cross-sectional views of FIGS. 8B and 8C.

It will be understood that one or more of the tasks, functions, or methodologies described herein (e.g., including those described herein for components 132, 134, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed on a processing device in the form of a programmable integrated circuit (e.g., processor such as CPU, controller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, controller, microcontroller, microprocessor, FPGA, CPLD and ASIC. The computer program of instructions may include an ordered listing of executable instructions for implementing logical functions in an information handling system or component thereof. The executable instructions may include a plurality of code segments operable to instruct components of an information handling system to perform the methodologies disclosed herein.

It will also be understood that a processing device may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed methods and apparatus may be utilized in various combinations and/or independently. Thus the invention is not limited to only those combinations shown herein, but rather may include other combinations.

What is claimed is:

1. A system, comprising:
   a first chassis component coupled to a second chassis component around one or more heat sources, a first air intake opening being defined in at least one of the first chassis component or the second chassis component, and at least one air outlet opening defined in at least one of the first chassis component and/or second chassis component;
   a planar vapor chamber thermally coupled to the one or more heat sources and being positioned between the first chassis component and the second chassis component, where the first chassis component and second chassis component define a cavity contiguous with the vapor chamber, the first air intake opening, and the at least one air outlet opening;
   a radial impeller disposed in the cavity and rotatably coupled to the vapor chamber, the radial impeller rotating to draw in air from outside the chassis by a first air flow path through the first air intake opening and to exhaust the air by a second air flow path through the at least one air outlet opening; and
   at least one heat pipe coupled in fluid communication with the vapor chamber, at least a portion of the heat pipe being positioned adjacent or within the second air flow path or the at least one air outlet opening.

2. The system of claim 1, further comprising at least one fin stack thermally coupled to the at least one heat pipe, the at least one fin stack including a plurality of parallel plates extending outward from the heat pipe in a position within the second air flow path or the at least one air outlet opening so that the parallel plates contact the exhausted air.

3. The system of claim 1, where the one or more heat sources comprise at least one of a central processing unit (CPU) or a graphics processing unit (GPU).

4. The system of claim 3, further comprising a printed circuit board coupled between the vapor chamber and at least one of the CPU or GPU.

5. The system of claim 1, where the radial impeller has no cowl, and where the radial impeller is completely open on both top and bottom sides with no top or bottom cap.

6. The system of claim 1, where the first air intake opening is defined in the first chassis component; and where the system further comprises:
   a second air intake opening defined in the second chassis component with the vapor chamber positioned between the first and second chassis components, and the radial impeller positioned between the vapor chamber and the first air intake opening; and
   where one or more openings are defined through the plane of the vapor chamber to provide a third air flow path to draw in air from outside of the chassis from the second air intake opening to the radial impeller.

7. The system of claim 1, where a center axle of the radial impeller is coupled to the vapor chamber at one or more points; and where an outer boundary of each of the one or more openings are completely contained in a region of the planar vapor chamber that is within a radius of the radial impeller.

8. The system of claim 7, where the system comprises a notebook computer having a keyboard supported on an external top side of the first chassis component of the notebook computer; where the first air intake opening is defined in the first chassis component through the topside of the notebook computer adjacent the keyboard; and where the second air intake opening is defined in the second chassis component through the underside of the notebook computer.

9. The system of claim 1, further comprising a plurality of air outlet openings defined in at least one of the first chassis component and/or second chassis component; where the cavity defined between the first chassis component and second chassis component is contiguous with the vapor chamber, the first air intake opening, and each of the plurality of air outlet openings; and where the radial impeller rotates to draw in air from outside the chassis by a first air flow path through the first air intake opening and to exhaust the air by a respective additional air flow path through each of the plurality of air outlet openings.

10. The system of claim 9, where the system comprises a notebook computer that comprises:
    a keyboard supported on an external top side of the first chassis component of the notebook computer adjacent a front side of the notebook computer; and
    a lid coupled to a back side of the notebook computer at a hinge line;
    where the plurality of air outlet openings comprise air outlet openings positioned on each of the backside, right side, and left side of the notebook computer adjacent the hinge line.

11. The system of claim 1, further comprising:
    a planar gasket coupled to the first chassis component in a position between the radial impeller and the first air intake opening, and in spaced relation to the radial impeller;
    an opening defined through the gasket to form a gasket opening, the gasket opening being dimensioned and positioned such that outer boundaries of the gasket opening are positioned entirely within the outer diameter of the radial impeller.

12. The system of claim 11, where the planar gasket opening is defined as a circle having a center that is aligned with a center axle of the radial impeller about which the impeller rotates, and where a radius of the gasket opening is less than two-thirds of a radius of the radial impeller.

13. The system of claim 11, where the system comprises a notebook computer that comprises:
    a keyboard supported on an external top side of the first chassis component of the notebook computer adjacent a front side of the notebook computer; and
    where the planar gasket comprises a keyboard support material having a first portion positioned beneath the keyboard to support the keyboard on the first chassis component, and a second portion that extends beyond a boundary of the keyboard with the gasket opening defined in the second portion of the planar gasket.

14. An apparatus, comprising: a planar vapor chamber; a radial impeller rotatably coupled to the vapor chamber; at least one heat pipe coupled in fluid communication with the vapor chamber, the vapor chamber being an evaporator and the heat pipe being a condenser for a working fluid contained therein; and at least one fin stack thermally coupled to the at least one heat pipe, the at least one fin stack including a plurality of parallel plates; where one or more openings are defined through the plane of the vapor chamber to provide an air flow path through the vapor chamber to an intake of the radial impeller.

15. The apparatus of claim 14, where the radial impeller has no cowl, and where the radial impeller is completely open on at least one side with no cap on that side.

16. The apparatus of claim 14, where the radial impeller is coupled to the vapor chamber at one or more points; and where an outer boundary of each of the one or more openings are completely contained in a region of the planar vapor chamber that is within a radius of the radial impeller.

17. A method, comprising:
    operating a system that comprises:
        a first chassis component coupled to a second chassis component around one or more heat sources, a first air intake opening being defined in at least one of the first chassis component or the second chassis component, and at least one air outlet opening defined in at least one of the first chassis component and/or second chassis component,
        a planar vapor chamber thermally coupled to the one or more heat sources generating heat, the vapor chamber being positioned between the first chassis component and the second chassis component, where the first chassis component and second chassis component define a cavity contiguous with the vapor chamber, the first air intake opening, and the at least one air outlet opening,
        a radial impeller disposed in the cavity and rotatably coupled to the vapor chamber, and
        at least one heat pipe coupled in fluid communication with the vapor chamber;
    rotating the radial impeller to draw in air from outside the chassis by a first air flow path through the first air intake opening and to exhaust the air by a second air flow path through the at least one air outlet opening, at least a portion of the heat pipe being positioned adjacent or within the second air flow path or the at least one air outlet opening;
    absorbing heat in the vapor chamber from the one or more heat sources to vaporize at least a portion of liquid working fluid contained within the vapor chamber and cause the vaporized fluid to travel from the vapor chamber to the heat pipe; and
    causing the exhausted air to absorb heat from the at least a portion of the heat pipe positioned adjacent or within the second air flow path to condense the vaporize working fluid back into a condensed liquid that returns to the vapor chamber.

18. The method of claim 17, where the system further comprises: at least one fin stack thermally coupled to the at least one heat pipe, the at least one fin stack including a plurality of parallel plates extending outward from the heat pipe in a position within the second air flow path or the at least one air outlet opening so that the parallel plates contact the exhausted air; and where the one or more heat sources comprise at least one of a central processing unit (CPU) or a graphics processing unit (GPU).

19. The method of claim 17, where the radial impeller has no cowl, and where the radial impeller is completely open on both top and bottom sides with no top or bottom cap.

20. The method of claim 17, where the system comprises a notebook computer having a keyboard supported on an external top side of the first chassis component of the notebook computer; and where the first air intake opening is either defined in the first chassis component through the topside of the notebook computer adjacent the keyboard, or is defined in the second chassis component through the underside of the notebook computer.

* * * * *